(12) United States Patent
Lee

(10) Patent No.: US 10,205,058 B2
(45) Date of Patent: Feb. 12, 2019

(54) LIGHT-EMITTING DEVICE PACKAGE AND LIGHT-EMITTING APPARATUS COMPRISING SAME

(71) Applicant: LG INNOTEK CO., LTD., Seoul (KR)

(72) Inventor: Sang Youl Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/542,340

(22) PCT Filed: Nov. 16, 2015

(86) PCT No.: PCT/KR2015/012260
§ 371 (c)(1),
(2) Date: Jul. 7, 2017

(87) PCT Pub. No.: WO2016/111454
PCT Pub. Date: Jul. 14, 2016

(65) Prior Publication Data
US 2018/0277719 A1 Sep. 27, 2018

(30) Foreign Application Priority Data
Jan. 8, 2015 (KR) .................. 10-2015-0002819

(51) Int. Cl.
*H01L 33/38* (2010.01)
*H01L 33/50* (2010.01)
(Continued)

(52) U.S. Cl.
CPC ............ *H01L 33/382* (2013.01); *H01L 33/06* (2013.01); *H01L 33/22* (2013.01); *H01L 33/32* (2013.01);
(Continued)

(58) Field of Classification Search
None
See application file for complete search history.

(56) References Cited

U.S. PATENT DOCUMENTS 8,476,644 B2 * 7/2013 Illek ................. H01L 33/382
257/79
8,546,836 B2 * 10/2013 Kamiya ............. H01L 33/20
257/99
(Continued)

FOREIGN PATENT DOCUMENTS

JP 2000-77717 A 3/2000
JP 2012-142339 A 7/2012
(Continued)

OTHER PUBLICATIONS

Machine Translation of KR 10 2012 0031342.*

*Primary Examiner* — Joseph Schoenholtz
(74) *Attorney, Agent, or Firm* — Birch, Stewart, Kolasch & Birch, LLP

(57) ABSTRACT

A light-emitting device package of embodiments comprises: a substrate; a light-emitting structure which is arranged below the substrate comprises a first conductive type semiconductor layer, an active layer, and a second conductive type semiconductor layer; a first electrode which is connected to the first conductive type semiconductor layer; a first insulation layer which is arranged on the side section of the light-emitting structure and the side and lower sections of the first electrode; a first pad which passes through the first insulation layer and is connected to the first conductive type semiconductor layer; a second electrode which passes through the first insulation layer, the first conductive type semiconductor layer and the active layer and is connected to the second conductive type semiconductor layer; a second pad which is connected to the second electrode; and a protective layer which extends from the top of the first insulation layer arranged on the side section of the light-emitting structure to the top of the first insulation layer (Continued)

arranged on the top of the first electrode, and is arranged so as to cover a bent part of the first insulation layer.

20 Claims, 4 Drawing Sheets

(51) Int. Cl.
| H01L 33/22 | (2010.01) |
| H01L 33/06 | (2010.01) |
| H01L 33/62 | (2010.01) |
| H01L 33/32 | (2010.01) |
| H01L 33/46 | (2010.01) |
| H01L 33/40 | (2010.01) |
| H01L 33/36 | (2010.01) |
| H01L 33/44 | (2010.01) |

(52) U.S. Cl.
 CPC ............ *H01L 33/36* (2013.01); *H01L 33/405* (2013.01); *H01L 33/44* (2013.01); *H01L 33/46* (2013.01); *H01L 33/502* (2013.01); *H01L 33/62* (2013.01); *H01L 2933/0016* (2013.01); *H01L 2933/0025* (2013.01)

(56) References Cited

U.S. PATENT DOCUMENTS

| 8,716,732 | B2 * | 5/2014 | Kamiya | H01L 33/382 |
| | | | | 257/15 |
| 9,461,209 | B2 * | 10/2016 | Tsai | H01L 33/382 |
| 2010/0012963 | A1 | 1/2010 | Hwan | |
| 2010/0013383 | A1 | 1/2010 | Kim et al. | |
| 2012/0074441 | A1 | 3/2012 | Seo et al. | |
| 2013/0168637 | A1 | 7/2013 | Teranishi et al. | |
| 2013/0313587 | A1 * | 11/2013 | Lin | H01L 33/62 |
| | | | | 257/95 |
| 2015/0200230 | A1 * | 7/2015 | Jang | H01L 27/156 |
| | | | | 257/91 |
| 2017/0236977 | A1 * | 8/2017 | Oh | F21K 9/238 |
| | | | | 257/13 |

FOREIGN PATENT DOCUMENTS

| JP | 2013-138126 A | | 7/2013 | |
| KR | 10-2010-0054433 A | | 5/2010 | |
| KR | 10-2012-0031342 A | | 4/2012 | |
| KR | 20120031342 A | * | 4/2012 | ........... H01L 27/153 |
| KR | 10-2014-0058080 A | | 5/2014 | |

* cited by examiner

[FIG. 1]
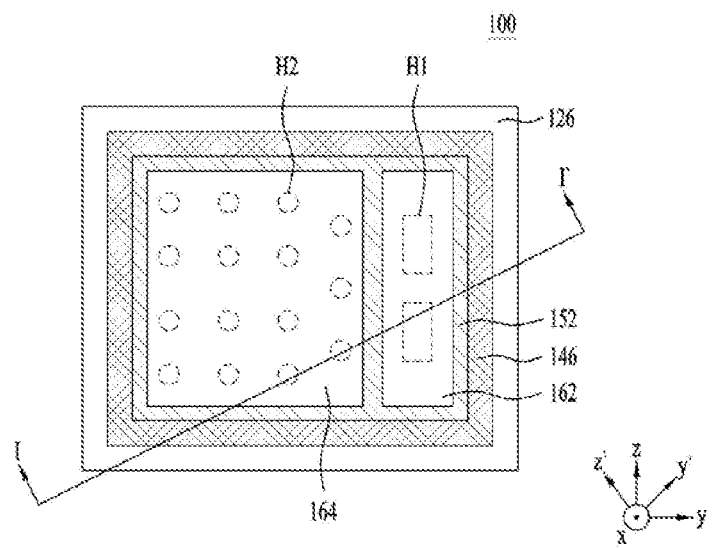
[FIG. 2]
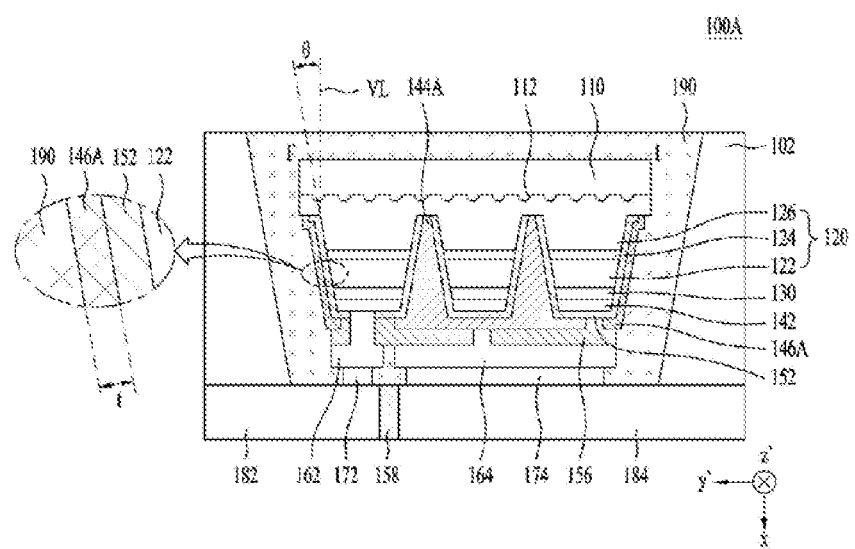

[FIG 3]
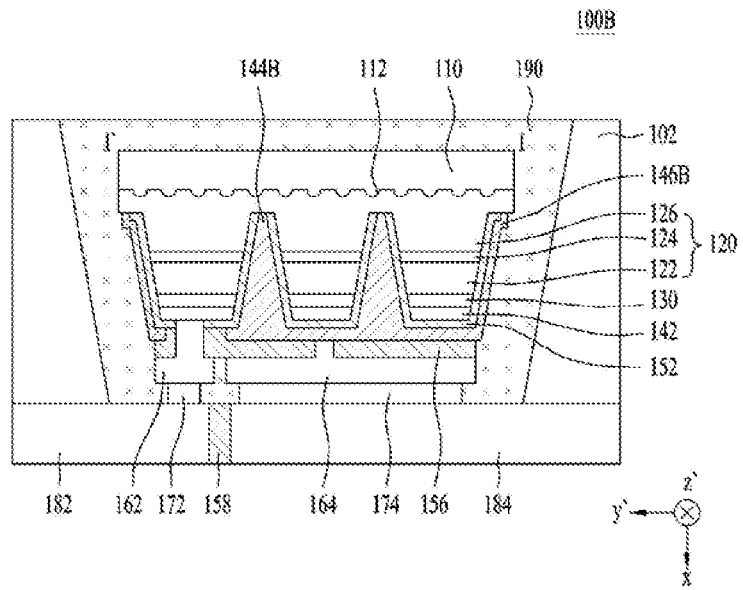
[FIG. 4]
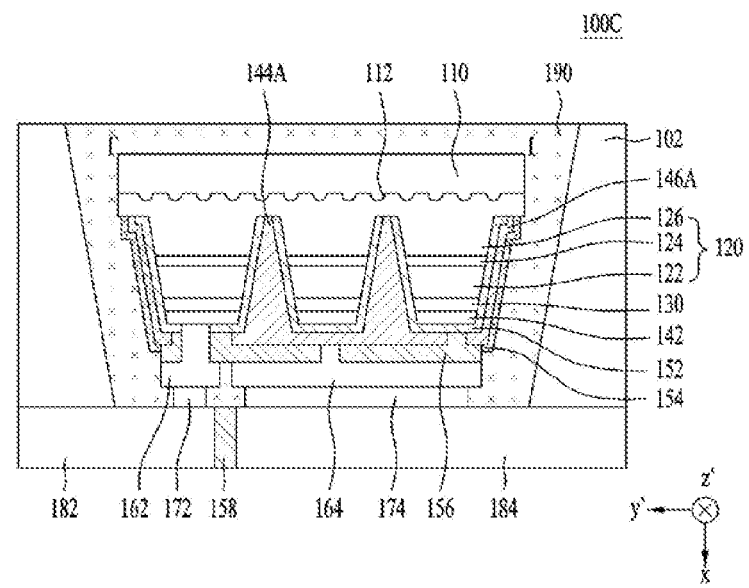

【FIG. 5a】
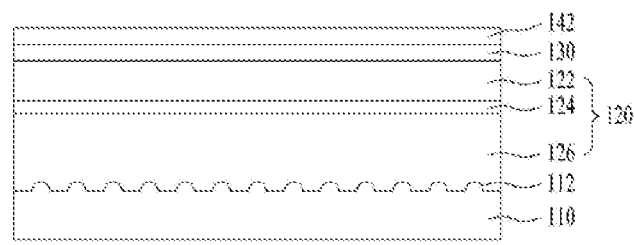
【FIG. 5b】
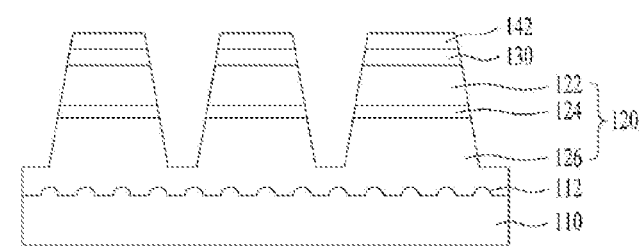
【FIG. 5c】
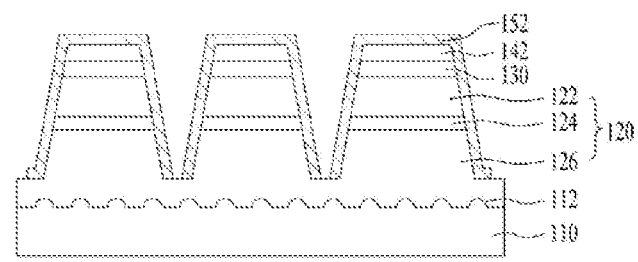
【FIG. 5d】
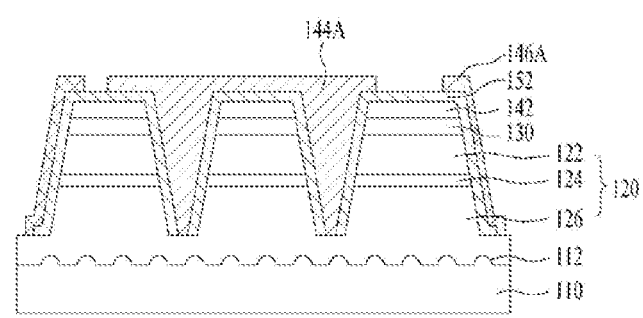

[FIG. 5e]
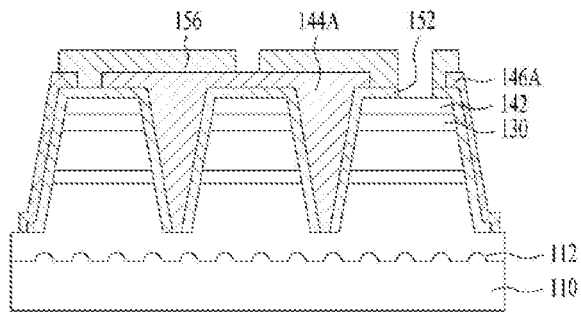
[FIG. 6a]
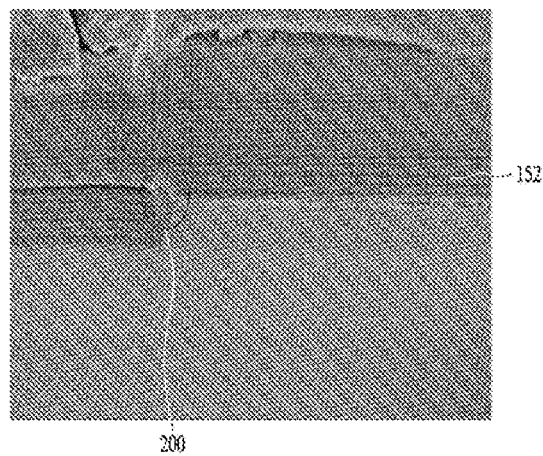
[FIG. 6b]
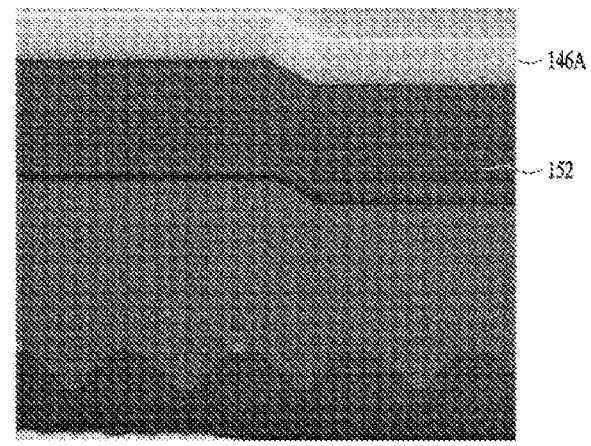

LIGHT-EMITTING DEVICE PACKAGE AND LIGHT-EMITTING APPARATUS COMPRISING SAME

CROSS REFERENCE TO RELATED APPLICATIONS

This application is the National Phase of PCT International Application No. PCT/KR2015/012260, filed on Nov. 16, 2015, which claims priority under 35 U.S.C. 119(a) to Patent Application No. 10-2015-0002819, filed in the Republic of Korea on Jan. 8, 2015, all of which are hereby expressly incorporated by reference into the present application.

TECHNICAL FIELD

Embodiments relate to a light-emitting device package and a light-emitting apparatus including the same.

BACKGROUND ART

Light-emitting diodes are one type of semiconductor device that converts electricity into infrared rays or light using the characteristics of compound semiconductors, in order to transmit or receive signals or to be used as a light source.

Group III-V nitride semiconductors are in the spotlight as a core material for light-emitting devices such as, for example, light-emitting diodes (LEDs) or laser diodes (LDs) due to the physical and chemical properties thereof.

Such light-emitting diodes have excellent environmental friendliness because they include no environmentally harmful materials such as mercury (Hg), which has conventionally been used in lighting apparatuses such as, for example, incandescent lamps and fluorescent lamps, and also have other advantages, for example, a long lifespan and low power consumption. Therefore, existing light sources are being replaced with light-emitting diodes.

In the case of a conventional light-emitting device package including the light-emitting devices described above, an insulation layer is disposed on the lateral side and the top side of a light-emitting structure. However, there is the possibility of a bent portion of the insulation layer being damaged.

Technical Object

Embodiments provide a light-emitting device package and a light-emitting apparatus including the same, which may exhibit reliability even in a high-temperature and high-humidity environment.

Technical Solution

A light-emitting device package of one embodiment may include a substrate, a light-emitting structure disposed under the substrate and including a first conductive semiconductor layer, an active layer, and a second conductive semiconductor layer, a first electrode connected to the first conductive semiconductor layer, a first insulation layer disposed on a side portion of the light-emitting structure and on a side portion and a lower portion of the first electrode, a first pad configured to penetrate the first insulation layer so as to be connected to the first conductive semiconductor layer, a second electrode configured to penetrate the first insulation layer, the first conductive semiconductor layer, and the active layer so as to be connected to the second conductive semiconductor layer, a second pad connected to the second electrode, and a protective layer disposed to extend from a top of the first insulation layer, disposed on the side portion of the light-emitting structure, to a top of the first insulation layer disposed on the first electrode so as to surround a bent portion of the first insulation layer.

For example, the light-emitting device package may further include a second insulation layer disposed on the protective layer.

For example, the side portion of the light-emitting structure may be tilted at an inclination angle smaller than 65 degrees relative to a vertical direction that is parallel to a thickness direction of the light-emitting structure.

For example, the protective layer may include at least one of a metal, a ceramic, or a polymer.

For example, the protective layer may have a thickness ranging from 5 nm to 10 nm.

For example, the first electrode may include silver (Ag).

For example, the protective layer may be connected to the second electrode. In this case, the protective layer and the second electrode may be formed of the same material. The protective layer and the second electrode may be electrically connected to each other. The protective layer and the second electrode may be integrated.

Alternatively, for example, the protective layer may be spaced apart from the second electrode.

For example, the light-emitting device package may further include a third insulation layer disposed under the first insulation layer and the second electrode, and the first pad may penetrate the first and third insulation layers to thereby be connected to the first electrode.

For example, the protective layer may have a multilayer structure or a single-layer structure.

For example, the protective layer and the second electrode may be electrically connected to each other.

For example, the second insulation layer may be disposed so as to surround the protective layer.

For example, the protective layer may have a plan shape to surround an edge of the first insulation layer.

For example, the light-emitting device package may further include a conductive light-transmitting layer disposed between the first electrode and the light-emitting structure.

A light-emitting device package according to another embodiment may include a substrate, a light-emitting structure disposed under the substrate and including a first conductive semiconductor layer, an active layer, and a second conductive semiconductor layer, a first electrode connected to the first conductive semiconductor layer, a first insulation layer disposed to surround a side portion and a lower portion of the light-emitting structure and a side portion and a lower portion of the first electrode, a first pad configured to penetrate the first insulation layer so as to be connected to the first conductive semiconductor layer, a second electrode configured to penetrate the first insulation layer, the first conductive semiconductor layer, and the active layer so as to be connected to the second conductive semiconductor layer, a second pad connected to the second electrode, and a protective layer disposed to surround the first insulation layer from one bent end of the first insulation layer that surround an entire side portion of the light-emitting structure to a remaining bent end of the first insulation layer that surrounds a lower portion of the first electrode, the protective layer being integrated with the second electrode. In addition, a light-emitting device package according to still another embodiment may include a substrate, a light-emitting structure disposed under the substrate and including a first conductive semiconductor layer, an active layer, and a second conductive semiconductor layer, first and second electrodes connected respectively to the first and second conductive semiconductor layers, an insulation layer disposed on a side portion of the light-emitting structure and on a side portion and a lower portion of the first electrode, and a protective layer disposed to extend from a top of the insulation layer, disposed on the side portion of the light-emitting structure, to a top of the insulation layer disposed on the first electrode so as to surround a bent portion of the insulation layer. The bent portion of the insulation layer may include a portion to surround a corner corresponding to a boundary between the side portion and the lower portion of the first electrode.

A lighting apparatus according to a further embodiment includes the light-emitting device package.

Advantageous Effects

A light-emitting device package and a light-emitting apparatus including the same according to embodiments may have enhanced reliability since a protective layer prevents moisture from being introduced into a first insulation layer so as to prevent damage to the first insulation layer, despite the migration of Ag, which forms an electrode, in a high-temperature and high-humidity environment.

DESCRIPTION OF DRAWINGS

FIG. 1 is a plan view of a light-emitting device package according to an embodiment.

FIG. 2 is a cross-sectional view taken along line I-I' of the light-emitting device package illustrated in FIG. 1 according to one embodiment.

FIG. 3 is a cross-sectional view illustrating another embodiment taken along line I-I' of the light-emitting device package illustrated in FIG. 1 according to another embodiment.

FIG. 4 is a cross-sectional view taken along line I-I' of the light-emitting device package illustrated in FIG. 1 according to a still another embodiment.

FIGS. 5a to 5e are process cross-sectional views of the light-emitting device package illustrated in FIG. 2.

FIGS. 6a and 6b are photographs illustrating first insulation layers of the light-emitting device packages according to a comparative example and the embodiment.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

In the drawings, the size of each layer (or each portion) may be exaggerated, omitted or schematically illustrated for clarity and convenience. In addition, the size of each element does not wholly reflect an actual size thereof. In addition, the same reference numerals indicate the same elements throughout the description of the drawings.

Although light-emitting device packages 100, 100A, 100B, and 100C according to embodiments will be described using the Cartesian coordinate system, they may of course be described using other coordinate systems. With the Cartesian coordinate system, although the x-axis, the y-axis and the z-axis are orthogonal to one another and the x-axis, the y'-axis and the z'-axis are orthogonal to one another, as illustrated in the respective drawings, the embodiments are not limited thereto. That is, the x-axis, the y-axis and the z-axis may cross one another, and the x-axis, the y'-axis and the z'-axis may cross one another.

FIG. 1 is a plan view of a light-emitting device package 100 according to an embodiment, and FIG. 2 is a cross-sectional view taken along line I-I' of the light-emitting device package 100 illustrated in FIG. 1 according to one embodiment 100A.

Referring to FIGS. 1 and 2, the light-emitting device package 100 or 100A according to one embodiment may include a package body 102, a substrate 110, a light-emitting structure 120, a conductive light-transmitting layer 130, a first electrode 142, a second electrode 144A, a protective layer 146 or 146A, a first insulation layer 152, a third insulation layer 156, a fourth insulation layer 158, a first pad 162, a second pad 164, a first solder part 172, a second solder part 174, first and second lead frames 182 and 184, and a molding member 190.

For convenience of description, the package body 102, the first and second solder parts 172 and 174, the first and second lead frames 182 and 184, and the molding member 190 illustrated in FIG. 2 are not illustrated in FIG. 1.

The package body 102 may define a cavity C. For example, as illustrated in FIG. 2, the package body 102 may define the cavity C in conjunction with the first and second lead frames 182 and 184. That is, the cavity C may be defined by the inner side surface of the package body 102 and the respective upper surfaces of the first and second lead frames 182 and 184. However, the embodiment is not limited thereto. According to another embodiment, unlike the illustration of FIG. 2, the package body 102 may define the cavity C alone. Alternatively, a barrier wall (not illustrated) may be disposed on the package body 102 having a flat upper surface so that a cavity is defined by the barrier wall and the upper surface of the package body 102. Although the package body 102 may be formed of, for example, an epoxy molding compound (EMC), the embodiment is not limited as to the material of the package body 102.

The light-emitting structure 120 may be disposed under the substrate 110.

The substrate 110 may include a conductive material or a non-conductive material. For example, although the substrate 110 may include at least one of sapphire ($Al_2O_3$), GaN, SiC, ZnO, GaP, InP, $Ga_2O_3$, GaAs, or Si, the embodiment is not limited as to the material of the substrate 110.

In order to solve a problem related to the difference in the coefficient of thermal expansion and lattice-mismatching between the substrate 110 and the light-emitting structure 120, a buffer layer (or a transition layer) (not illustrated) may further be provided between the two 110 and 120. The buffer layer may include at least one material selected from the group consisting of Al, In, N, and Ga, for example, without being limited thereto. In addition, the buffer layer may have a single-layer or multilayer structure.

In addition, in order to increase light extraction efficiency from the light-emitting device package 100 or 100A, a light extraction pattern 112 may be formed underneath the substrate 110. In this case, the substrate 110 may be a patterned sapphire substrate (PSS).

The light-emitting structure 120 may include a first conductive semiconductor layer 122, an active layer 124, and a second conductive semiconductor layer 126. The second conductive semiconductor layer 126, the active layer 124, and the first conductive semiconductor layer 122 may be stacked one above another in sequence from the substrate 110 toward the first and second lead frames 182 and 184 (i.e. in the x-axis direction).

The first conductive semiconductor layer 122 may be disposed under the active layer 124. The first conductive semiconductor layer 122 may be formed of a semiconductor compound such as, for example, a group III-V or II-VI semiconductor compound. For example, the first conductive semiconductor layer 122 may include a semiconductor material having a composition of $In_xAl_yGa_{(1-x-y)}N$ ($0 \le x \le 1$, $0 \le y \le 1$, $0 \le x+y \le 1$). The first conductive semiconductor layer 122 may be doped with a first conductive dopant. When the first conductive semiconductor layer 122 is a p-type semiconductor layer, the first conductive dopant may be a p-type dopant and may include, for example, Mg, Zn, Ca, Sr, or Ba.

The active layer 124 may be disposed between the conductive semiconductor layer 122 and the second conductive semiconductor layer 126. The active layer 124 is a layer in which holes (or electrons) introduced through the first conductive semiconductor layer 122 and electrons (or holes) introduced through the second conductive semiconductor layer 126 meet each other to emit light having energy that is determined by the inherent energy band of a constituent material of the active layer 124. The active layer 124 may have at least one structure among a single-well structure, a multi-well structure, a single-quantum well structure, a multi-quantum well (MQW) structure, a quantum dot structure, and a quantum wire structure.

The active layer 124 may include a well layer and a barrier layer having a pair structure of any one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may further be formed on and/or under the active layer 124. The conductive clad layer may be formed of a semiconductor having higher band gap energy than the band gap energy of the barrier layer of the active layer 124. For example, the conductive clad layer may include, for example, a GaN, AlGaN, InAlGaN, or super-lattice structure. In addition, the conductive clad layer may be doped to an n-type or a p-type.

According to the embodiment, the active layer 124 may emit light in an ultraviolet wavelength band. Here, the ultraviolet wavelength band means the wavelength band ranging from 100 nm to 400 nm. In particular, the active layer 124 may emit light in a wavelength band ranging from 100 nm to 280 nm. However, the embodiment is not limited as to the wavelength band of the light emitted from the active layer 124.

The second conductive semiconductor layer 126 may be disposed between the substrate 110 and the active layer 124. The second conductive semiconductor layer 126 may be formed of, for example, a group III-V or II-VI semiconductor compound, which is doped with a second conductive dopant. When the second conductive semiconductor layer 126 is an n-type semiconductor layer, the second conductive dopant may be an n-type dopant and may include Si, Ge, Sn, Se, or Te, without being limited thereto.

For example, the second conductive semiconductor layer 126 may include a semiconductor material having a composition of $Al_xIn_yGa_{(1-x-y)}N$ ($0 \le x \le 1$, $0 \le y \le 1$, $0 \le x+y \le 1$). The second conductive semiconductor layer 126 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The first conductive semiconductor layer 122 may be configured as a p-type semiconductor layer, and the second conductive semiconductor layer 126 may be configured as an n-type semiconductor layer. Alternatively, the first conductive semiconductor layer 122 may be configured as an n-type semiconductor layer, and the second conductive semiconductor layer 126 may be configured as a p-type semiconductor layer.

The light-emitting structure 120 may have any one structure among an n-p junction structure, a p-n junction structure, an n-p-n junction structure, and a p-n-p junction structure.

The conductive light-transmitting layer 130 may be disposed between the light-emitting structure 120 and the first electrode 142. The conductive light-transmitting layer 130 may be a transparent conductive oxide (TCO) layer. For example, the conductive light-transmitting layer 130 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO, but is not limited to these materials. In some cases, the conductive light-transmitting layer 130 may be omitted.

The first electrode 142 may be disposed under the first conductive semiconductor layer 122 and may be electrically connected to the first conductive semiconductor layer 122. For example, as illustrated in FIG. 2, the first electrode 142 may be electrically connected to the first conductive semiconductor layer 122 through the conductive light-transmitting layer 130.

The first electrode 142 may be formed of a reflective material such as silver (Ag). The first electrode 142 may exhibit an ohmic characteristics and may include a material capable of being in ohmic contact with the first conductive semiconductor layer 122. When the first electrode 142 performs the role of -the ohmic layer, a separate ohmic layer (not illustrated) may not be formed.

As described above, when the first electrode 142 serves as a light reflection layer, the light emitted from the active layer 124 and directed toward the first and second lead frames 182 and 184 may be reflected, which may increase light extraction efficiency.

The first insulation layer 152 may be disposed on the lateral portion of the light- emitting structure 120 and may also be disposed on the lateral portion and the lower (or, bottom) portion of the first electrode 142. The first insulation layer 152 may be disposed so as to surround the lateral portion and the lower (or, bottom) portion of the light-emitting structure 120 and the lateral portion and the bottom portion of the first electrode 142. Here, one end of the first insulation layer 152, which surrounds the entire lateral portion of the light-emitting structure, may have a bent cross-sectional shape, and the other end of the first insulation layer 152, which surrounds a portion of the bottom portion and the lateral portion of the first electrode 142, may also have a bent cross-sectional shape.

The first pad 162 may penetrate the first insulation layer 152 and may be electrically connected to the first conductive semiconductor layer 122 through the first electrode 142 and the conductive light-transmitting layer 130. To this end, a first through-hole may be formed to penetrate the third insulation layer 156 described later and the first insulation layer 152 and the first pad 162 may be electrically connected to the first electrode 142 through the first through-hole.

Meanwhile, the second electrode 144A may be electrically connected to the second conductive semiconductor layer 126, which is exposed through the first insulation layer 152, the first electrode 142, the conductive light-transmitting layer 130, the first conductive semiconductor layer 122, and the active layer 124 by mesa etching. That is, by mesa-etching the first insulation layer 152, the first electrode 142, the conductive light-transmitting layer 130, the first conductive semiconductor layer 122, the active layer 124 and a portion of the second conductive semiconductor layer 126, a second through-hole, which penetrates the first conductive semiconductor layer 122 and the active layer 124, is formed. At this time, the second electrode 144A may be electrically connected to the second conductive semiconductor layer 126 through the second through-hole. The first insulation layer 152 may be disposed between the second electrode 144A and the first conductive semiconductor layer 122 so as to electrically separate the two 144A and 122 from each other. In addition, the first insulation layer 152 may be disposed between the second electrode 144A and the active layer 124 so as to electrically separate the two 144A and 124 from each other.

In order to assist in understanding, the first through-hole H1 covered by the first pad 162 and the second through-hole H2 covered by the second pad 164 are represented by dotted lines in FIG. 1.

When the second electrode 144A includes an ohmic contact material and performs the role of an ohmic layer, a separate ohmic layer (not illustrated) may not be disposed. Alternatively, a separate ohmic layer may be disposed on or under the second electrode 144A.

The light-emitting device package 100 or 100A illustrated in FIGS. 1 and 2 may have a flip chip bonding structure, and therefore the light emitted from the active layer 124 may be emitted through the second electrode 144A, the second conductive semiconductor layer 126, and the substrate 110. To this end, the second electrode 144A, the second conductive semiconductor layer 126, and the substrate 110 may be formed of a light-transmitting material. At this time, although the first conductive semiconductor layer 122 and the first electrode 142 may be formed of a light-transmitting or non-transmitting material or a reflective material, the embodiment is not limited to a particular material.

Each of the first and second electrodes 142 and 144A may be formed of any material that may not absorb the light emitted from the active layer 124, but that may reflect or transmit the light and that may be grown to a good quality on the first and second conductive semiconductor layers 122 and 126. For example, each of the first and second electrodes 142 and 144A may be formed of a metal, and more specifically may be formed of Ag, Ni, Al, Rh, Pd, Ir, Ru, Mg, Zn, Pt, Au, Hf, or a selective combination thereof.

Meanwhile, the second pad 164 may be electrically separated from the first pad 162 and may be electrically connected to the second electrode 144A. The second pad 164 may be connected to the second electrode 144A through a third through-hole, which penetrates the third insulation layer 156 described later and disposed under the first conductive semiconductor layer 122.

Each of the first and second pads 162 and 164 described above may include a metal having electrical conductivity, and may include a material that is the same as or different from the material of each of the first and second electrodes 142 and 144.

In addition, in the case of FIG. 1, although each of the first and second pads 162 and 164 is illustrated as having a rectangular plan shape, the embodiment is not limited thereto. For example, according to another embodiment, each of the first and second pads 162 and 164 may have an oval plan shape or various polygonal plan shapes such as a triangular or pentagonal plan shape.

The protective layer 146A may be disposed so as to extend from the top of the first insulation layer 152, disposed on the lateral portion of the light-emitting structure 120, onto the first insulation layer 152 disposed under the first electrode 142. That is, the protective layer 146A may be disposed so as to surround a bent portion of the first insulation layer 152. Here, the bent portion of the first insulation layer 152 may correspond to the portion that surrounds a corner at the boundary of the lateral portion and the bottom portion of the first electrode 142.

In addition, referring to FIG. 1, the protective layer 146A may be shaped to surround the edge of the first insulation layer 152 in a plan view.

In the case of FIG. 2, although the protective layer 146A is illustrated as a single layer, the embodiment is not limited thereto. That is, according to another embodiment, the protective layer 146A may have a multilayer structure. In addition, the protective layer 146A may include at least one of a metal, a ceramic, or a polymer.

The embodiments are not limited the material and the number of stacked layers of the protective layer 146A as long as the protective layer is capable of preventing external moisture from being introduced into the first insulation layer 152.

In addition, the thickness t of the protective layer 146A may change depending on the type of the first insulation layer 152. When the first insulation layer 152 is formed of an oxide and the thickness t of the protective layer 146A is below 5 nm, it may be difficult to form the protective layer 146A having a uniform thickness using a metal, and thus the protective layer 146A may not faithfully play a role in protecting the first insulation layer 152. Alternatively, when the thickness t of the protective layer 146A is above 10 nm, the protective layer may be subjected to stress. Thus, although the thickness t of the protective layer 146A may range from 5 nm to 10 nm, the embodiment is not limited thereto.

FIG. 3 is a cross-sectional view taken along line I-I' of the light-emitting device package 100 illustrated in FIG. 1 according to another embodiment 100B.

In the case of the light-emitting device package 100A illustrated in FIG. 2, the protective layer 146A is spaced apart from the second electrode 144A. However, as illustrated in FIG. 3, a protective layer 146B may be disposed so as to be connected to the second electrode 144B. Except for this, the light-emitting device package 100B illustrated in FIG. 3 is the same as the light-emitting device package 100A illustrated in FIG. 2, and thus is designated by the same reference numerals. Thus, a description related to the same parts of the light-emitting device package 100B illustrated in FIG. 3 is replaced with the description of the light-emitting device package 100A illustrated in FIG. 2.

Referring to FIG. 3, the protective layer 146B may be disposed to surround the first insulation layer 152 from one bent end of the first insulation layer 152, which surrounds the entire lateral portion of the light-emitting structure 120, to the other bent end of the first insulation layer 152, which surrounds the bottom portion of the first electrode 142, and may be integrally formed with the second electrode 144B. That is, the first insulation layer 152 may be disposed so as to surround the edge of the light-emitting structure 120, and the protective layer 146B may be disposed so as to surround the first insulation layer 152.

As illustrated in FIG. 3, when the protective layer 146B is disposed so as to be connected to the second electrode 144B, the material of the protective layer 146B may be the same as the material of the second electrode 144B. That is, the protective layer 146B and the second electrode 144B may be formed of the same material, for example, a metal. In this case, the protective layer 146B may be electrically connected to the second electrode 144B and may play the role of the second electrode 144B as well as its inherent role. Accordingly, the second electrode 144B may extend to the side surface of the light-emitting structure 120.

In this way, the protective layer 146B and the second electrode 144B may be integrally formed with each other.

As described above, although the protective layers 146A and 146B and the second electrodes 144A and 144B may be formed of the same material as each other, they may be formed of different materials according to another embodiment.

FIG. 4 is a cross-sectional view taken along line I-I' of the light-emitting device package 100 illustrated in FIG. 1 according to a still another embodiment 100C.

Unlike the light-emitting device package 100A illustrated in FIG. 2, the light-emitting device package 100C illustrated in FIG. 4 may further include a second insulation layer 154. The second insulation layer 154 may be disposed on the protection layer 146A. That is, the second insulation layer 154 may be disposed so as to surround the protective layer 146A. Except for this, the light-emitting device package 100C illustrated in FIG. 4 is the same as the light-emitting device package 100A illustrated in FIG. 2, and thus is designated by the same reference numerals. Thus, a description related to the same parts is replaced with the description of the light-emitting device package 100A illustrated in FIG. 2.

Again referring again to FIG. 2, the third insulation layer 156 may be disposed under the first insulation layer 152 and under the second electrode 144A, respectively. In this case, as described above, the first pad 162 may be electrically connected to the first electrode 142 through the first through-hole, which penetrates the first and third insulation layers 152 and 156.

Each of the first and second pads 162 and 164 described above may include a metal having electrical conductivity, and may include a material that is the same as or different from the material of each of the first and second electrodes 142 and 144A.

When the lateral portion of the light-emitting structure 120 has a large inclination angle θ relative to the vertical direction VL, which is parallel to the thickness direction (e.g. the x-axis direction) of the light-emitting structure 120, the bent portion (or stepped portion) of the first insulation layer 152 may be gently formed, and thus is less likely to admit external moisture. However, when the inclination angle θ is small, the stepped portion of the first insulation layer 152 may be steeply formed, and thus is more likely to admit moisture. According to the embodiment, even when the inclination angle θ is below 65 degrees, the protective layer 146A may protect the first insulation layer 152 from moisture.

Meanwhile, the first and second solder parts 172 and 174 of the light-emitting device package 100A illustrated in FIG. 2 may be electrically connected to the first and second pads 162 and 164, respectively. That is, the first solder part 172 may be disposed under the first pad 162, and the second solder part 174 may be disposed under the second pad 164.

In addition, the first solder part 172 may be electrically connected to the first lead frame 182, and the second solder part 174 may be electrically connected to the second lead frame 184. That is, the first solder part 172 may be disposed between the first lead frame 182 and the first pad 162 so as to electrically connect the two 162 and 182 to each other, and the second solder part 174 may be disposed between the second lead frame 184 and the second pad 164 so as to electrically connect the two 164 and 184 to each other.

Each of the first solder part 172 and the second solder part 174 may be a solder paste or a solder ball.

The first and second lead frames 182 and 184 may be disposed to be spaced apart from each other in the direction (i.e. the y'-axis direction) that is orthogonal to the thickness direction (i.e. the x-axis direction) of the light-emitting structure 120. Each of the first and second lead frames 182 and 184 may be formed of a conductive material, for example, a metal, and the embodiment is not limited as to the type of the material of each of the first and second lead frames 182 and 184. In order to electrically separate the first and second lead frames 182 and 184, the fourth insulation layer 158 may be disposed between the first and second lead frames 182 and 184.

In addition, when the package body 102 is formed of a conductive material, for example, a metal, the first and second lead frames 182 and 184 may constitute a portion of the package body 102. Even in this case, portions of the package body 102 that form the first and second lead frames 182 and 184 may be electrically separated from each other by the fourth insulation layer 158.

Although each of the first to fourth insulation layers 152, 154, 156, and 158 described above may include at least one of $SiO_2$, $TiO_2$, $ZrO_2$, $Si_3N_4$, $Al_2O_3$, or $MgF_2$, the embodiment is not limited as to the material of the first to fourth insulation layers 152, 154, 156, and 158.

In addition, each of the first, second and third insulation layers 152, 154, and 156 may be configured as a distributed Bragg reflector (DBR). The distributed Bragg reflector may perform an insulation function and may also perform a reflection function. The distributed Bragg reflector may have a structure in which first and second layers having different indices of refraction are alternately stacked one above another at least once. Each layer of the distributed Bragg reflector may be formed of an electrically insulating material. For example, the first layer may include a first dielectric layer such as $TiO_2$, and the second layer may include a second dielectric layer such as $SiO_2$. For example, the distributed Bragg reflector may have a structure in which $TiO_2/SiO_2$ layers are stacked at least once. The thickness of each of the first and second layers may be $\lambda/4$, and "$\lambda$" may be the wavelength of light generated in a light-emitting cell.

Meanwhile, the first and second solder parts 172 and 174 may electrically connect the first and second conductive semiconductor layers 122 and 126 to the first and second lead frames 182 and 184 through the first and second pads 162 and 164, respectively, thereby eliminating the need for wires. However, according to another embodiment, the first and second conductive semiconductor layers 122 and 126 may electrically be connected to the first and second lead frames 182 and 184, respectively, using wires.

In some cases, the first solder part 172 and the second solder part 174 may be omitted. In this case, the first pad 162 may serve as the first solder part 172, and the second pad 164 may serve as the second solder part 174. When the first solder part 172 and the second solder part 174 are omitted, the first pad 162 may be directly connected to the first lead frame 182, and the second pad 164 may be directly connected to the second lead frame 184.

Meanwhile, the molding member 190 may surround and protect the substrate 110, the light-emitting structure 120, the protective layer 146A, the third insulation layer 156, the lateral portions of the first and second pads 162 and 164, and the lateral portions of the first and second solder parts 172 and 174.

The molding member 190 may be formed of, for example, silicon (Si), and may convert the wavelength of light emitted from the light-emitting device because it includes a fluorescent substance. Here, the light-emitting device may correspond to the remaining portions excluding the package body 102, the fourth insulation layer 158, the first and second pads 162 and 164, the first and second solder parts 172 and 174, and the first and second lead frames 182 and 184 in the light-emitting device package 100A illustrated in FIG. 2. Although the fluorescent substance may include a fluorescent material of any wavelength conversion member that may convert the light generated in the light-emitting device into white light such as a YAG-based, TAG-based, silicate-based, sulfide-based, or nitride-based fluorescent substance, the embodiment is not limited as to the type of the fluorescent substance.

The YAG-based and TAG-based fluorescent materials may be selected from among (Y, Tb, Lu, Sc, La, Gd, Sm)3(Al, Ga, In, Si, Fe)5(O, S)12:Ce, and the silicate-based fluorescent material may be selected from among (Sr, Ba, Ca, Mg)2SiO$_4$: (Eu, F, Cl).

In addition, the sulfide-based fluorescent material may be selected from among (Ca, Sr)S:Eu and (Sr, Ca, Ba) (Al, Ga)2S4:Eu, and the nitride-based fluorescent substance may be selected from among (Sr, Ca, Si, Al, O)N:Eu (e.g. CaAlSiN4:Eu β-SiAlON:Eu) and (Cax, My)(Si, Al)12(O,N) 16, which is based on Ca-α SiAlON:Eu (where M is at least one material of Eu, Tb, Yb, or Er, 0.05<(x+y)<0.3, 0.02<x<0.27 and 0.03<y<0.3).

As a red fluorescent substance, a nitride-based fluorescent substance including N (e.g. CaAlSiN$_3$:Eu) may be used. Such a nitride-based red fluorescent substance may have higher reliability with respect to the external environment such as, for example, heat and moisture, and lower discoloration possibility than a sulfide-based fluorescent substance.

Hereinafter, a method of manufacturing the light-emitting device package 100A illustrated in FIG. 2 will be described with reference to FIGS. 5a to 5e as attached. However, the embodiment is not limited thereto, and the light-emitting device package 100A illustrated in FIG. 2 may of course be manufactured by various manufacturing methods. In addition, the light-emitting device packages 100B and 100C illustrated in FIGS. 3 and 4 may of course be manufactured via a method similar to the method of manufacturing the light-emitting device package 100A illustrated in FIG. 2.

FIGS. 5a to 5e are process cross-sectional views of the light-emitting device package 100A illustrated in FIG. 2.

First, referring to FIG. 5a, the light-emitting structure 120 is formed on the substrate 110. Here, the second conductive semiconductor layer 126, the active layer 124, and the first conductive semiconductor layer 122 may be sequentially stacked one above another on the substrate 110. Thereafter, the conductive light-transmitting layer 130 and the first electrode 142 are formed on the light-emitting structure 120.

Subsequently, referring to FIG. 5b, the first electrode 142, the conductive light-transmitting layer 130, the first conductive semiconductor layer 122, the active layer 124, and a portion of the second conductive semiconductor layer 126 are removed via mesa etching so as to form the second through-hole that exposes the second conductive semiconductor layer 126.

Subsequently, referring to FIG. 5c, the first insulation layer 152 is formed on the lateral portion of the light-emitting structure 120, the lateral portion of the conductive light-transmitting layer 130, and the lateral portion and the top portion of the first electrode 142. At this time, the first insulation layer 152 is formed so as to expose the second conductive semiconductor layer 126 in the second through-hole.

Subsequently, referring to FIG. 5d, the second electrode 144A is formed to fill the second through-hole so as to be connected to the second conductive semiconductor layer 126, which has been exposed by etching, and the protective layer 146A is formed on the first insulation layer 152 so as to protect the first insulation layer 152.

Subsequently, referring to FIG. 5e, the third insulation layer 156 is formed on the second electrode 144A, on the protective layer 146A, and on the first electrode 142. At this time, the portion of the second and third insulation layers 152 and 156 that is located in the portion in which the first pad 162 will be connected to the first electrode 142 is etched to form the first through-hole that exposes the first electrode 142.

Subsequently, referring again to FIG. 2, the first pad 162 is formed so as to be electrically connected to the first electrode 142, which has been exposed through the first through-hole. In addition, the second pad 164 is formed so as to be electrically connected to the second electrode 144A, which has been exposed by etching the third insulation layer 156.

Subsequently, the first solder part 172 is formed on the first pad 162, and the second solder part 174 is formed on the second pad 164.

FIGS. 6a and 6b are photographs illustrating the first insulation layers of the light-emitting device packages according to a comparative example and the embodiment.

With the exception that the light-emitting device package according to the comparative example does not include the protective layer 146A, the light-emitting device package according to the comparative example is assumed as being identical to the light-emitting device packages 100, 100A, 100B, or 100C according to the embodiments.

When the first electrode 142 is formed of Ag or an Ag alloy having excellent reflectivity, the light-emitting device package may be destroyed due to the migration of Ag when Ag reacts with water in a high-humidity environment. In order to prevent this problem, the first insulation layer 152 is disposed. However, the bent portion of the first insulation layer 152, i.e. the portion of the first insulation layer 152 that is bent and stepped from the side surface to the upper surface of the light-emitting structure 120 may have an uneven thickness due to deterioration in layer quality, and there may still be the possibility of introduction of moisture. When the migration of Ag occurs, as illustrated in FIG. 6a, the bent portion 200 of the first insulation layer may be destroyed and cause a defect.

In order to solve this problem, in the case of the light-emitting device package 100, 100A, 100B, or 100C according to the above-described embodiment, the protective layer 146A or 146B is disposed so as to surround the bent portion of the first insulation layer 152, which covers the side surface and the upper surface of the light-emitting structure 120. Accordingly, despite the migration of Ag under a high-temperature and high-humidity environment, the protective layer 146A or 146B may suppress the introduction of moisture to the first insulation layer 152, and as illustrated in FIG. 6b, the first insulation layer 152 may not be destroyed and the reliability of the light-emitting device package 100, 100A, 100B, or 100C may be increased.

A plurality of light-emitting device packages according to the embodiment may be arranged on a board, and optical members such as, for example, a light guide plate, a prism sheet, and a diffuser sheet may be disposed on the optical path of the light-emitting device package. The light-emitting device packages, the board, and the optical members may function as a backlight unit.

In addition, the light-emitting device package according to the embodiment may be included in a light-emitting apparatus such as, for example, a display apparatus, an indicator apparatus, and a lighting apparatus.

Here, the display apparatus may include a bottom cover, a reflector disposed on the bottom cover, a light-emitting module for emitting light, a light guide plate disposed in front of the reflector to guide light emitted from the light-emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module that includes a board and the light-emitting device package according to the embodiment, a radiator that dissipates heat of the light source module, and a power supply unit that processes or converts an electrical signal received from the outside to provide the same to the light source module. For example, the lighting apparatus may include a lamp, a headlamp, or a street light.

The headlamp may include a light-emitting module that includes light-emitting device packages disposed on a board, a reflector that reflects light emitted from the light-emitting module in a given direction, for example, in the forward direction, a lens that refracts light reflected by the reflector forward, and a shade that blocks or reflects some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

[Mode for Invention]

Various embodiments have sufficiently been described in the best mode to implement the disclosure.

INDUSTRIAL APPLICABILITY

A light-emitting device package according to the embodiment and a light-emitting apparatus including the same may be used in a display apparatus, an indicator apparatus, and a lighting apparatus.

The invention claimed is:

1. A light-emitting device package, comprising:
a substrate;
a light-emitting structure disposed under the substrate and including a first conductive semiconductor layer, an active layer, and a second conductive semiconductor layer;
a first electrode connected to the first conductive semiconductor layer;
a first insulation layer disposed on a side portion of the light-emitting structure and on a side portion and a lower portion of the first electrode;
a first pad configured to penetrate the first insulation layer so as to be connected to the first conductive semiconductor layer;
a second electrode configured to penetrate the first insulation layer, the first conductive semiconductor layer, and the active layer so as to be connected to the second conductive semiconductor layer;
a second pad connected to the second electrode; and
a protective layer disposed to extend from a top of the first insulation layer, disposed on the side portion of the light-emitting structure, to a top of the first insulation layer disposed on the first electrode so as to surround a bent portion of the first insulation layer,
wherein the protective layer has a plan shape to surround an edge of the first insulation layer and the protective layer surrounds outer edges of the first insulation layer in a closed loop shape and covers an outermost lateral edge of the first insulation layer.

2. The package according to claim 1, further comprising a second insulation layer disposed on the protective layer.

3. The package according to claim 1, wherein the side portion of the light-emitting structure is tilted at an inclination angle smaller than 65 degrees relative to a vertical direction that is parallel to a thickness direction of the light-emitting structure.

4. The package according to claim 1, wherein the protective layer includes at least one of a metal, a ceramic, or a polymer.

5. The package according to claim 4, wherein the protective layer has a thickness ranging from 5 nm to 10 nm.

6. The package according to claim 1, wherein the first electrode includes silver (Ag).

7. The package according to claim 1, wherein the protective layer is connected to the second electrode.

8. The package according to claim 7, wherein the protective layer and the second electrode are formed of the same material.

9. The package according to claim 1, wherein the protective layer is spaced apart from the second electrode.

10. The package according to claim 1, further comprising a third insulation layer disposed under the first insulation layer and the second electrode, wherein the first pad penetrates the first and third insulation layers to thereby be connected to the first electrode.

11. The package according to claim 1, wherein the protective layer has a multilayer structure.

12. The package according to claim 7, wherein the protective layer and the second electrode are electrically connected to each other.

13. The package according to claim 1, wherein the protective layer has a single-layer structure.

14. The package according to claim 7, wherein the protective layer and the second electrode are integrated.

15. The package according to claim 2, wherein the second insulation layer is disposed so as to surround the protective layer.

16. The package according to claim 1, wherein the first insulation layer is a distributed Bragg reflector (DBR).

17. The package according to claim 1, further comprising a conductive light-transmitting layer disposed between the first electrode and the light-emitting structure.

18. A light-emitting device package, comprising:
a substrate;
a light-emitting structure disposed under the substrate and including a first conductive semiconductor layer, an active layer, and a second conductive semiconductor layer;
first and second electrodes connected respectively to the first and second conductive semiconductor layers;
an insulation layer disposed on a side portion of the light-emitting structure and on a side portion and a lower portion of the first electrode; and
a protective layer disposed to extend from a top of the insulation layer, disposed on the side portion of the light-emitting structure, to a top of the insulation layer disposed on the first electrode so as to surround a bent portion of the insulation layer,
wherein the protective layer has a plan shape to surround an edge of the insulation layer and the protective layer surrounds outer edges of the first insulation layer in a closed loop shape and covers an outermost lateral edge of the first insulation layer.

19. A light-emitting device package, comprising:
a substrate;
a light-emitting structure disposed under the substrate and including a first conductive semiconductor layer, an active layer, and a second conductive semiconductor layer;
a first electrode connected to the first conductive semiconductor layer;
a first insulation layer disposed to surround a side portion and a lower portion of the light-emitting structure and a side portion and a lower portion of the first electrode;
a first pad configured to penetrate the first insulation layer so as to be connected to the first conductive semiconductor layer;
a second electrode configured to penetrate the first insulation layer, the first conductive semiconductor layer, and the active layer so as to be connected to the second conductive semiconductor layer;
a second pad connected to the second electrode; and
a protective layer disposed to surround the first insulation layer from one bent end of the first insulation layer that surrounds an entire side portion of the light-emitting structure to a remaining bent end of the first insulation layer that surrounds a lower portion of the first electrode, the protective layer being integrated with the second electrode,
wherein the protective layer has a plan shape to surround an edge of the first insulation layer and the protective layer surrounds outer edges of the first insulation layer in a closed loop shape and covers an outermost lateral edge of the first insulation layer.

20. A lighting apparatus comprising the light-emitting device package according to claim 1.

* * * * *